(12) United States Patent
Mohseni (10) Patent No.: US 9,472,597 B2
(45) Date of Patent: Oct. 18, 2016

(54) SYSTEMS, APPARATUSES AND METHODS FOR CONVERTING LIGHT WAVELENGTHS

(71) Applicant: NORTHWESTERN UNIVERSITY, Evanston, IL (US)

(72) Inventor: Hooman Mohseni, Wilmette, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 14/209,155

(22) Filed: Mar. 13, 2014

(65) Prior Publication Data

US 2014/0264025 A1  Sep. 18, 2014

Related U.S. Application Data

(60) Provisional application No. 61/790,896, filed on Mar. 15, 2013.

(51) Int. Cl.

| | |
|---|---|
| *G01J 5/00* | (2006.01) |
| *H01L 27/32* | (2006.01) |
| *H01L 31/055* | (2014.01) |
| *H01L 51/42* | (2006.01) |
| *H01L 25/16* | (2006.01) |

(52) U.S. Cl.
CPC ........... *H01L 27/32* (2013.01); *H01L 27/3227* (2013.01); *H01L 31/055* (2013.01); *H01L 51/422* (2013.01); *H01L 25/167* (2013.01)

(58) Field of Classification Search
CPC ............... H01L 2224/48091; H01L 2924/00; H01L 2924/00014; H01L 25/0753; H01L 33/58; H01L 31/147; H01L 31/02245; H01L 31/0543; H01L 31/0682

USPC ...................................................... 250/338.1
See application file for complete search history.

(56) References Cited

U.S. PATENT DOCUMENTS

| | | | | |
|---|---|---|---|---|
| 5,300,788 A | * | 4/1994 | Fan ..................... | G02B 27/0093 257/13 |
| 5,345,093 A | * | 9/1994 | Mathur ..................... | G02F 2/02 257/185 |

(Continued)

OTHER PUBLICATIONS

Memis, Omer Gokalp, et al., New Generation of Isolated Nano-injection Detectors and Imagers, EECS Department Northwestern University, Evanston, IL, 2011.

(Continued)

*Primary Examiner* — David J Makiya
*Assistant Examiner* — Taeho Jo
(74) *Attorney, Agent, or Firm* — Bell & Manning, LLC (57) ABSTRACT

In one aspect, an apparatus for converting light having a first wavelength to a light having a second wavelength is provided. The apparatus includes an interband light detector configured to detect light with the first wavelength, a light emitting device configured to emit light with the second wavelength, and a connector connecting the light detector to the light emitting device. In another aspect, an apparatus includes an absorber layer configured to absorb light having a first wavelength, a barrier and trap layer adjacent the absorber layer, an injector layer adjacent the barrier and trap layer, and an emitting device configured to emit light having a second wavelength. In a further aspect, a method is provided and includes absorbing an input light having a first wavelength, converting the first wavelength to a second wavelength different in size than the first wavelength, and emitting an output light having the second wavelength.

19 Claims, 5 Drawing Sheets

(56) References Cited

U.S. PATENT DOCUMENTS

| | | | | |
|---|---|---|---|---|
| 5,510,627 | A * | 4/1996 | Snow | H01L 31/0352 257/189 |
| 5,588,015 | A * | 12/1996 | Yang | B82Y 20/00 257/22 |
| 5,589,876 | A * | 12/1996 | Konuma | H04N 5/33 250/332 |
| 5,799,026 | A * | 8/1998 | Meyer | B82Y 20/00 257/22 |
| 6,028,323 | A * | 2/2000 | Liu | B82Y 20/00 257/21 |
| 7,282,777 | B1 | 10/2007 | Chuang | |
| 7,442,953 | B2 * | 10/2008 | Augusto | B82Y 20/00 257/184 |
| 7,804,640 | B1 * | 9/2010 | Bass | G02B 27/017 257/59 |
| 8,487,259 | B2 * | 7/2013 | Cho | H01L 27/14625 250/338.4 |
| 9,054,247 | B2 | 6/2015 | Mohseni | |
| 2002/0008191 | A1 * | 1/2002 | Faska | H01L 27/14625 250/208.1 |
| 2002/0074542 | A1 * | 6/2002 | Gunapala | B82Y 20/00 257/14 |
| 2002/0131463 | A1 * | 9/2002 | Bruno | B82Y 20/00 372/45.01 |
| 2005/0082520 | A1 * | 4/2005 | Fathimulla | B82Y 10/00 257/14 |
| 2006/0175550 | A1 * | 8/2006 | Siddiqi | G02B 21/16 250/338.1 |
| 2007/0085114 | A1 * | 4/2007 | De Rossi | H01L 31/0236 257/290 |
| 2007/0112259 | A1 | 5/2007 | Tateda et al. | |
| 2007/0158638 | A1 * | 7/2007 | Perera | B82Y 20/00 257/13 |
| 2007/0184575 | A1 | 8/2007 | Liu | |
| 2009/0140144 | A1 * | 6/2009 | Myrick | G01J 5/12 250/338.1 |
| 2009/0272903 | A1 * | 11/2009 | Kato | B82Y 20/00 250/338.4 |
| 2010/0032652 | A1 | 2/2010 | Okamura | |
| 2010/0038541 | A1 * | 2/2010 | Clark | B82Y 20/00 250/338.1 |
| 2010/0123120 | A1 * | 5/2010 | Mohseni | H01L 27/14643 257/21 |
| 2011/0024721 | A1 * | 2/2011 | Edamura | B82Y 20/00 257/13 |
| 2011/0156056 | A1 * | 6/2011 | Krames | H01L 33/0079 257/77 |
| 2011/0216105 | A1 | 9/2011 | Kamijima | |
| 2012/0075834 | A1 | 3/2012 | Wei et al. | |
| 2013/0008503 | A1 * | 1/2013 | McGrath | B82Y 10/00 136/256 |
| 2013/0082286 | A1 * | 4/2013 | Finkelstein | H01L 31/0336 257/84 |
| 2013/0215496 | A1 * | 8/2013 | Ban | H01L 27/3227 359/345 |
| 2014/0009905 | A1 * | 1/2014 | Kobayashi | H01L 27/322 362/84 |
| 2015/0287870 | A1 | 10/2015 | Mohseni | |

OTHER PUBLICATIONS

Memis, O. G., et al., A Short-Wave Infrared Nanoinjection Imager With 2500 A/W Responsivity and Low Excess Noise, IEEE Photonics Journal, vol. 2, No. 5, Oct. 2010, pp. 857-864.

Memis, Omer Gokalp, et al., Signal-to-noise performance of a short-wave infrared nanoinjection imager, Optics Letters, vol. 35, No. 16, Aug. 15, 2010, pp. 2699-2701.

Memis, Omer Gokalp, et al., Short-Wave Infrared Nano-Injection Imaging Sensors, IEEE Sensors 2010 Conference, pp. 128-131.

Memis, Omer Gokalp, et al., Resonant Tunneling Injection Detectors and Imagers, Dept. of Electrical Engineering and Computer Science, Northwestern University, Evanston, IL, pp. 363-364.

Memis, Omer Gokalp, et al., On the Source of Jitter in a Room-Temperature Nanoinjection Photon Detector at 1.55 µm, IEEE Electron Device Letters, vol. 29, No. 8, Aug. 2008, pp. 867-869.

Memis, Omer Gokalp, et al., Sub-Poissonian shot noise of a high internal gain injection photon detector, Optics Express, vol. 16, No. 17, Aug. 18, 2008, pp. 12701-12706.

Memis, Omer Gokalp, et al., Low Noise, High Gain Short-Wave Infrared Nano-Injection Photon Detectors with Low Jitter, Dept. of Electrical Engineering and Computer Science, Northwestern University, Evanston, IL, pp. 159-160.

Memis, Omer Gokalp, et al., A Bio-inspired Single Photon Detector with Suppressed Noise and Low Jitter, Proc. of SPIE, vol. 7035, pps. 70350V-1-70350V-12.

Memis, Omer Gokalp, et al., A photon detector with very high gain at low bias and at room temperature, Applied Physics Letters, 91, 2007, pp. 171112-1-171112.

Memis, Omer Gokalp, et al., A Type-II Near-Infrared Detector with Very High Stable Gain and Low Noise at Room Temperature, ISDRS 2007, Dec. 12-14, 2007, College Park, MD, USA.

Memis, O. G., et al., Detailed Numerical Modeling of a Novel Infrared Single Photon Detector for > 1 um, Department of Electrical Engineering and Computer Science, NUSOD 2007, pp. 63-64.

Memis, O. G., et al., A.Novel Avalanche Free Single Photon Detector, Department of Electrical Engineering and Computer Science, Northwestern University, Evanston, IL, pp. 742-745.

Memis, O. G., et al., A Novel Type-II Infrared Single Photon Detector, Northwestern University, Department of Electrical Engineering and Computer Science, pp. 29-30.

Mohseni, H., et al., A Novel Avalanche-Free Single Photon Detector, Northwestern University, Department of Electrical Engineering and Computer Science, pp. 163-165.

Mohseni, H., et al., A Novel Nano-Injector Based Single Photon Infrared Detector, Proc. of SPIE vol. 6243, pp. 62430X-1-62430X-6.

International Search Report and Written Opinion for PCT/US2014/026180 dated Aug. 28, 2014, 11 pages.

Sidhu, R. et al., A Long-Wavelength Photodiode on InP Using Lattice-Matched GaInAs—GaAsSb Type-II Quantum Wells, IEEE Photonics Technology Letters, vol. 17, No. 12, Dec. 2005, pp. 2715-2716.

Mohseni, H. et al., High performance type-II InAs/GaSb supperlattice photodiodes, Proceedings of SPIE vol. 4288, 2001, pp. 191-199.

\* cited by examiner

SYSTEMS, APPARATUSES AND METHODS FOR CONVERTING LIGHT WAVELENGTHS

RELATED APPLICATIONS

The present application claims the benefit of co-pending U.S. Provisional Patent Application No. 61/790,896, filed Mar. 15, 2013, the contents of which are incorporated by reference herein in their entirety.

FIELD OF THE INVENTION

The present disclosure generally relates to converting wavelengths of light and, more particularly, to converting light having a first wavelength to light having a second wavelength.

BACKGROUND

Infrared detectors and imagers exist. Some infrared imagers operate at wavelengths in excess of 1000 nanometers (nm), which is beyond the level of detection for a silicon detector. Such detectors and imagers convert incoming infrared photons to an electronic signal and require bump-bonding to integrate the detectors and imagers with a read out circuit, which results in bulky and expensive IR imagers.

SUMMARY

In one aspect, the subject matter of the present disclosure may eliminate the need for bump-bonding since infrared light is directly converted to visible light that may be directly viewed by the naked eye. The present disclosure may also be used to convert light beyond a silicon detection limit (e.g., wavelength>1000 nm) to light that is detectable by silicon CMOS and CCD detector or imager (e.g., wavelength<1000 nm). Silicon based detectors or imagers are low-cost and can capture the image in digital form.

In one aspect, the present disclosure may significantly reduce the weight, volume, and cost of infrared imagers.

In one aspect, the present disclosure is capable of producing a high gain as a result of producing more photons at an output than at an input configured to receive incoming photons. Such a high gain is important in many applications, especially where infrared light has a very low intensity such as, for example, night vision applications.

In one aspect, the present disclosure is based on integration of an infrared light detector and a visible light emitting device. In one example, the infrared detector and the light emitting device may be monolithically integrated. In one example, the infrared detector may be a nano-injection infrared detector. In one example, the light emitting device may be an organic light emitting diode (OLED), a light emitting diode (LED) or light emitting laser (VCSEL). The integrated infrared detector and visible light emitting device may produce a two-dimensional array that can directly convert an infrared image to a visible image. In one example, the present disclosure is configured to produce thousands of visible photons per each infrared photon detected at wavelengths longer than about 1.5 micrometers. In one example, the infrared detector, and its associated large internal gain, is used to achieve an up-conversion with a large gain.

In one aspect, a system is provided and includes an infrared detector adapted to detect infrared light and a light emitting device adapted to emit a visible light having a visually perceivable wavelength. The system is adapted to convert the infrared light to the visible light. The system may also include an infrared absorbing layer adapted to absorb the infrared light. The infrared absorbing layer may have a bandgap energy smaller than about 1.24 electron-volt. An electron-hole pair may be produced as result of the infrared absorbing layer absorbing the infrared light. The system may also include a barrier and trap layer adapted to simultaneously trap the holes and block electron injection. In one example, the barrier and trap layer may have a smaller area or be narrower in width than the infrared absorbing layer. The system may also include an electron hole pair supply layer that generates electron hole pairs. In one example, the electron hole pair supply layer may be a metallic layer. In one example, the electron hole pair supply layer may be a semi-metallic layer. In one example, it is desirable that the electron hole pair supply layer have small or zero band gap energy. The system may also include an injector layer to inject the holes into a visible light emitting device and to combine the holes with the electrons to produce photons having a wavelength that is detectable by a silicon-based detector or imager. In one example, the wavelength is less than 1000 nanometers. In one example, the silicon-based detector may be a conventional silicon CCD or CMOS detector or imager.

In one aspect, an apparatus for converting light having a first wavelength to a light having a second wavelength is provided. The apparatus includes an interband light detector configured to detect light with the first wavelength, a light emitting device configured to emit light with the second wavelength, and a connector connecting the light detector to the light emitting device. In one aspect, the first wavelength is greater than the second wavelength. In one aspect, the first wavelength is greater than 1000 nanometers and the second wavelength is less than 1000 nanometers. In one aspect, the light having the first wavelength is infrared light and the light having the second wavelength is visible light. In one aspect, the apparatus further includes an electron hole pair supplier configured to supply electron hole pairs. In one aspect, the connector is at least partially comprised of the electron hole pair supplier.

In one aspect, an apparatus for converting light having a first wavelength to a light having a second wavelength is provided. The apparatus includes an absorber layer configured to absorb light having the first wavelength, a barrier and trap layer adjacent the absorber layer, an injector layer adjacent the barrier and trap layer, and an emitting device configured to emit light having the second wavelength. In one aspect, the barrier and trap layer is narrower than the absorber layer. In one aspect, the barrier and trap layer and the injector layer are both narrower than the absorber layer. In one aspect, the absorber layer is formed on a substrate, and the substrate is transparent with respect to light having the first wavelength to enable light having the first wavelength to pass through the substrate. In one aspect, the absorber layer is formed on a substrate, the barrier and trap layer is formed on the absorber layer, and the injector layer is formed on the barrier and trap layer. In one aspect, the apparatus further includes an electron hole pair supply layer between the injector layer and the light emitting device. In one aspect, the light emitting device is at least partially comprised of at least one of an organic light emitting diode layer, a light emitting diode layer, and a vertical cavity surface emitting laser layer. In one aspect, the first wavelength is greater than the second wavelength. In one aspect, the first wavelength is greater than 1000 nanometers and the second wavelength is less than 1000 nanometers. In one aspect, the absorber layer is an interband absorber layer.

In one aspect, a method of converting an input light having a first wavelength to an output light having a second wavelength is provided. The method includes absorbing an input light having a first wavelength and converting the first wavelength to a second wavelength with the first wavelength and the second wavelength being different sizes. The method also includes emitting an output light having the second wavelength. In one aspect, the method further includes generating an electron-hole pair including an electron and a hole subsequent to absorbing the input light having the first wavelength. In one aspect, the method further includes injecting the hole into a light emitting device, injecting the electron into the light emitting device and combining the hole and the electron to form the output light having the second wavelength. In one aspect, the first wavelength is greater than 1000 nanometers and the second wavelength is less than 1000 nanometers. In one aspect, the method further includes amplifying the input light, and the step of emitting further includes emitting an amplified output light. In one aspect, the input light is comprised of at least one input photon and the amplified output light is comprised of a plurality of output photons. In one aspect, the step of amplifying further includes producing a plurality of electrons for each absorbed input photon, and the method further includes converting the plurality of electrons to the plurality of output photons.

BRIEF DESCRIPTION OF THE DRAWINGS

The present disclosure can be better understood with reference to the following drawings and description. The components in the figures are not necessarily to scale, emphasis instead being placed upon illustrating the principles of the disclosure.

DETAILED DESCRIPTION

Referring to FIGS. 1-6, one example of a system 20 for converting light from a first wavelength to a second wavelength is shown. The system 20 may convert light from a larger wavelength to a smaller wavelength. In one example, the system 20 may convert light having a wavelength of greater than 1000 nanometers (nm) to a light having a wavelength less than 1000 nanometers (nm). Some of the light having a wavelength greater than 1000 nm may qualify as infrared light and some of the light having a wavelength less than 1000 nm may qualify as visible light. Thus, in one example, the system 20 is configured to convert infrared light to visible light. Additionally, in one example, the system 20 is configured to amplify light. In this example, light input into the system 20 is amplified when output from the system. Furthermore, in one example, the system 20 is configured to both convert light from a first wavelength to a second wavelength and amplify the light.

Figure 1:
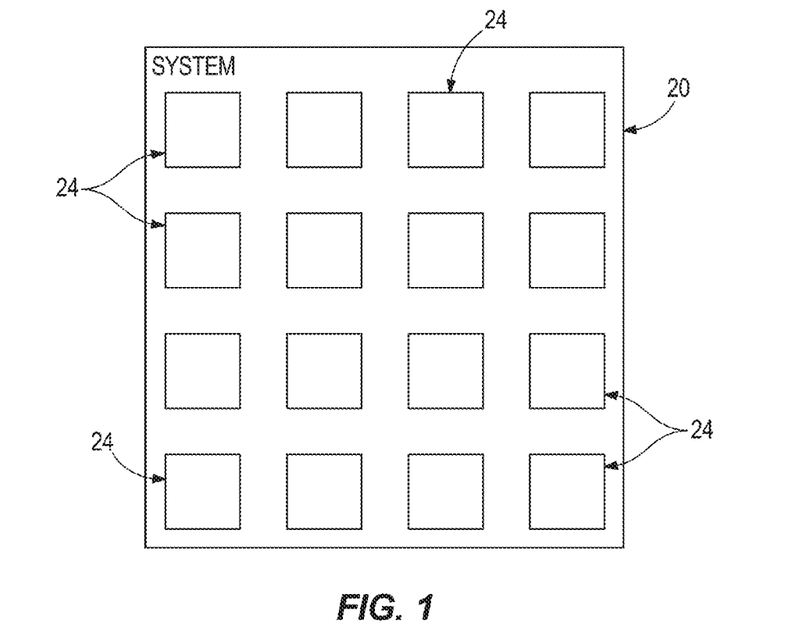
FIG. 1 is a schematic block diagram of one example of a system, according to one aspect of the present disclosure.

With particular reference to FIG. 1, in one example, the system 20 includes a plurality of apparatuses 24 configured to convert light from a first wavelength to a second wavelength. In this example, the first wavelength is greater in size than the second wavelength. Thus, in this example, the plurality of apparatuses 24 are configured to decrease the wavelength of light entering the apparatuses 24. In one example, the apparatuses 24 are also configured to amplify the light from input to output.

Figure 2:
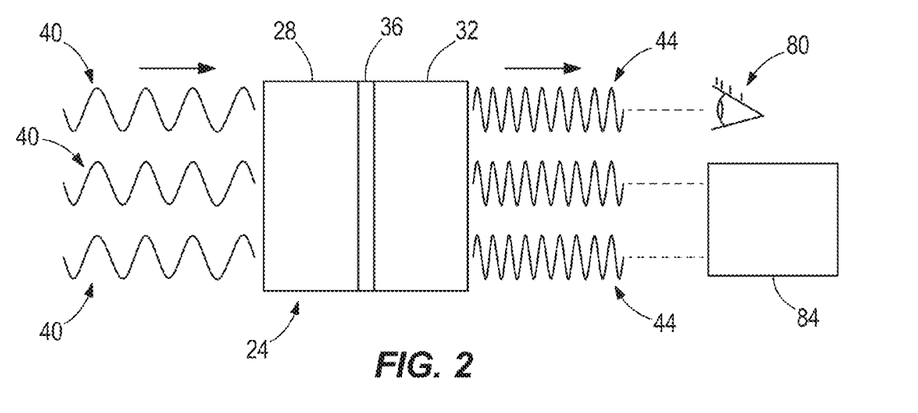
FIG. 2 is a schematic of one example of an apparatus of the system shown in FIG. 1, according to one aspect of the present disclosure.

Referring now to FIG. 2, each apparatus 24 is substantially similar and, therefore, only one apparatus 24 will be described in detail herein. In the illustrated example, the apparatus 24 includes a detector 28, a light emitting device 32, and a connector 36 for connecting the detector 28 and the light emitting device 32 together. In one example, the detector 28, the light emitting device 32, and the connector 36 are all monolithically integrated. Alternatively, the detector 28, the light emitting device 32 and the connector 36 may be formed and relate to each other in other manners. The detector 28 may be a wide variety of detectors and be capable of detecting light of varying wavelengths. In one example, the detector 28 is an infrared detector capable of detecting infrared light. In one example, the detector 28 may be able to detect light having a wavelength greater than 1000 nm. In one example, the detector 28 may be a nano-injection infrared detector. In one example, the detector 28 may be an interband detector. In this example, the interband detector 28 may be configured to excite electrons 68 from a top of a valence band 65 to a bottom of a conduction band 66. The valence band 65 has a lower energy and the conduction band 66 has a higher energy. Thus, electrons 68 move from a valence band to a conduction band. Conversely, an intersuband detector is configured to move electrons from a lower energy portion of a conduction band to a higher energy portion of the conduction band. Thus, electrons in an intersuband detector remain in and move within the same conduction band. Additionally, the light emitting device 32 may be a wide variety of light emitting devices. In one example, the light emitting device 32 is a visible light emitting device such as, for example, an organic light emitting diode (OLED), a light emitting diode (LED) or light emitting laser (VCSEL).

As illustrated in FIG. 1, in one example, the system 20 includes the plurality of apparatuses 24 oriented to produce a two-dimensional array that can directly convert light from a wavelength in access of 1000 nanometers to light having a wavelength less than 1000 nanometers. In one example, the apparatuses 24 can convert an infrared image or infrared light to a visible image or visible light. In this example, the apparatuses 24 are each configured to absorb infrared photons and produce and emit thousands of visible photons per each absorbed infrared photon. This conversion of one photon to thousands of photons may be referred to as an internal gain or amplification. Some examples of applications for which the system 20 may be used include, but are not limited to, low cost automotive night vision, ultra-light and compact night vision goggles, infrared surgical glasses/goggles, etc.

Figure 3:
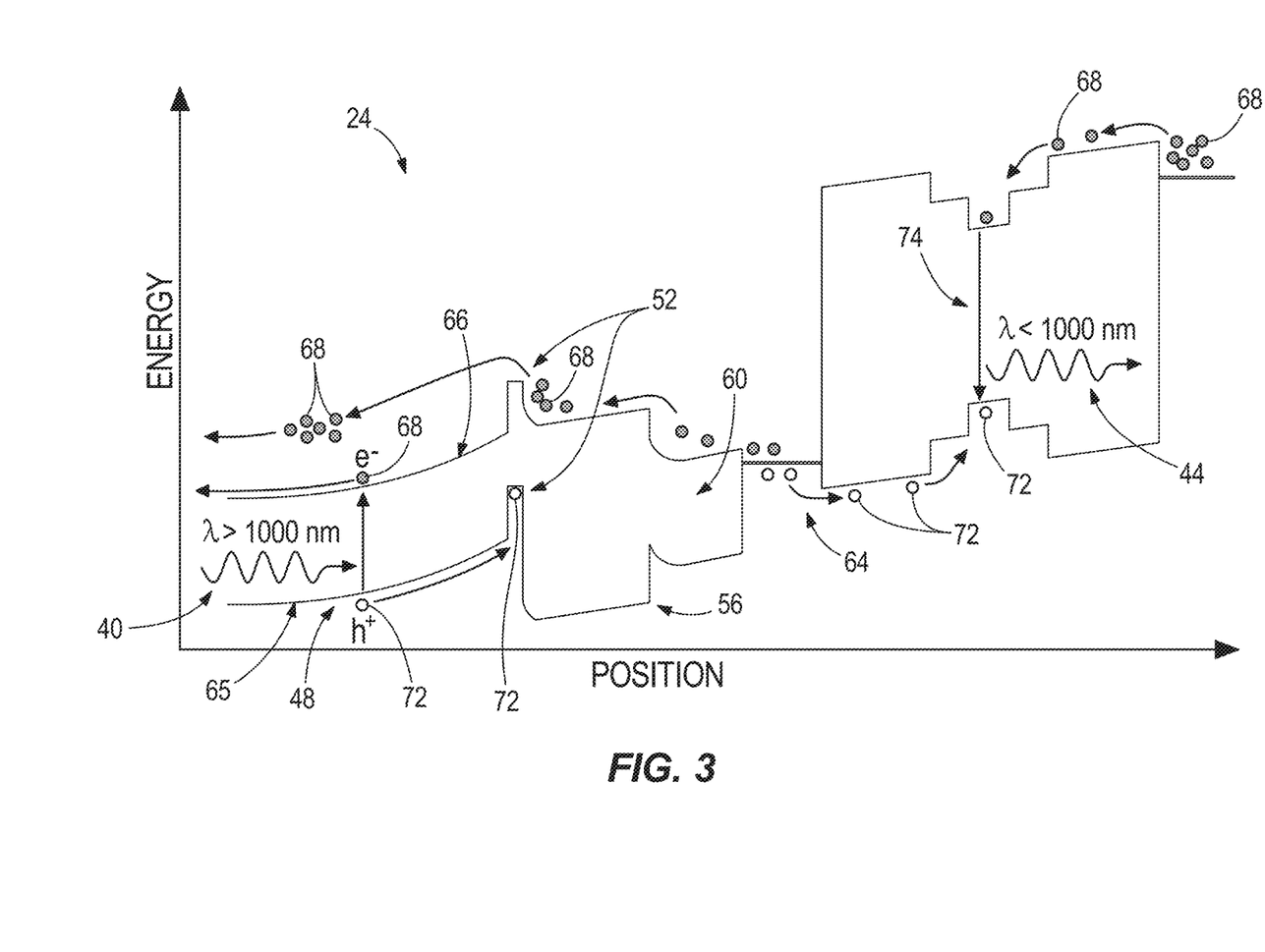
FIG. 3 is a diagram illustrating one example of an energy-band associated with the apparatus shown in FIG. 2, according to one aspect of the present disclosure.

Referring now to FIG. 3, an exemplary diagram representing one example of an energy band associated with one of the apparatuses 24 is illustrated. In this exemplary diagram, the energy band of the apparatus 24 illustrates various components of the apparatus 24 and how these components are associated with photons, electrons, electron holes, etc., and how the apparatus 24 is configured to receive light of a first wavelength 40, reduce the wavelength of the light to a second wavelength 44, and output or emit light having the second, reduced wavelength 44. This diagram also illustrates how the apparatus 24 is capable of amplifying the light from input to the emission of the light.

In this illustrated example, the apparatus 24 includes an absorber 48, a barrier and trap 52, an injector 56, a contact 60, an electron hole pair supplier 64 and a light emitting device 32. In one example, the absorber 48 may be an interband absorber 48. In this example, the absorber 48 may be configured to move electrons 68 from a top of the valence band 65 to a bottom of the conduction band 66. The valence band 65 has a lower energy and the conduction band 66 has a higher energy. Thus, electrons 68 move from a lower energy to a higher energy. In the illustrated example, the barrier and trap 52 is a single, unitary structure or member configured to act as both a barrier to electrons and a trap for holes. In other examples, the barrier and trap 52 may be separate members. In one example, the electron hole pair supplier 64 may be the connector 36. In one example, the contact 60 and the electron hole pair supplier 64 in combination may be the connector 36. In one example, the absorber 48, barrier and trap 52, the injector 56 and the contact 60 to the left of the electron hole pair supplier 64 may be grown on one substrate (e.g., made of InP), and the light emitting device 32 to the right of the electron hole pair supplier 64 may be grown on another substrate (e.g., made of GaAs).

With continued reference to FIG. 3, in this illustrated example, infrared light with first wavelengths 40 (e.g., greater than 1000 nm) arrive from a back of the apparatus 24 and is absorbed by the absorber 48 to produce an electron-hole pair, which includes both an electron 68 and a hole 72. In one example, the absorber 48 is made of InGaAs. Alternatively, the absorber 48 may be made of other materials. The hole 72 may be trapped in the barrier and trap 52. In one example, the barrier and trap 52 is a Type-II energy band alignment barrier and trap. The barrier and trap 52 simultaneously traps holes 72 and is a barrier to electrons 68. In one example, an area of the barrier and trap 52 may be smaller or narrower than an area of the absorber 48 to boost the gain of the apparatus 24 even at low light levels. In other examples, an area of the barrier and trap 52 may not be smaller or narrower than an area of the absorber 48. The apparatus 24 has gain or amplification that has been measured near about 10,000 electrons per each absorbed infrared (IR) photon. Moreover, noise of the apparatus 24 may be suppressed. Noise may be characterized as inconsistency in output of an apparatus without corresponding fluctuation of input. That is, the output of an apparatus may fluctuate without changing the input.

With further reference to FIG. 3, in this example, the barrier provided by the barrier and trap 52 lowers due to the trap of the hole 72 and allows the injector 56 to inject several thousand electrons 68 per each generated hole 72. The increased electron injection is compensated by increased flow of electrons 68 from the contact 60 and increased generation of electron-hole pair in the electron hole pair supplier 64. The creation of many electrons 68 for each absorbed photon results in amplification of the incoming light or photon 40 and output of an amplified light or photon 44. In one example, the electron hole pair supplier 64 may be metallic. In one example, the electron hole pair supplier 64 may be semi-metallic. In one example, the electron hole pair supplier 64 may be non-metallic. In one example, it is desirable that the electron hole pair supplier 64 have small or zero band gap energy. Holes 72 generated by the electron hole pair supplier 64 move toward and get trapped into a quantum well 74 of the light emitting device 32 and where the holes 72 will be recombined with electrons 68 in the quantum well 74 to produce photons (or light) having second wavelengths 44 that are shorter than the first wavelengths 40. In one example, the second wavelengths 44 will be less than 1000 nm. In one example, the light emitting device 32 may include a top contact 76 that is transparent and conductive such as, for example, ITO, CNT layer, thin metals, etc., or the top contact 76 may include holes or hole-arrays that allow high transmission of short-wave photons. These short-wave photons may be directly visible by a human eye 80, or may be detected by a silicon CMOS or CCD imager or detector 84 that is coupled (directly or indirectly) to the array provided by the system 20 via a short fiber optic faceplate, other light pipes, or any other manner of coupling.

In some examples, the aforementioned configuration of the apparatus 24 may be formed by wafer bonding that is based on a metal interface. Alternatively, in other examples, the aforementioned configuration of the apparatus 24 may be formed using non-metallic conductive bonding layers or even no bonding layer with so-called direct wafer fusion. In the absence of a metallic interface, a tunnel junction may be inserted between the detector 28 and the light emitting device 32. In one example, the tunnel junction is the connector 36. In one example, the tunnel junction is the electron hole pair supply layer 64. In one example, the tunnel junction is a combination of the contact 60 and the electron hole pair supply layer 64. In one example, tunnel junction is made of heavily-doped InGaAs-n$^{++}$/GaAsSb-p$^{++}$. The tunnel junction can effectively produce a high rate of electron-hole pairs, similar to a metallic or semi-metallic layer.

In the illustrated example of FIG. 3, the light emitting device 32 may be a light emitting diode (LED). However, one can replace the light emitting diode with a vertical cavity surface emitting laser (VCSEL). The benefit of VCSEL is a high conversion efficiency of injected electrons to short-wavelength photons as well as higher brightness due to the directionality of the emitted beam. It should be understood that the light emitting device 32 of the apparatus 24 may be any visible light emitting device and be within the spirit and scope of the present disclosure. Moreover, it should be understood that the light emitting device 32 may be any light emitting device that can emit a light have a wavelength equal to or less than 1000 nm.

Figure 4:
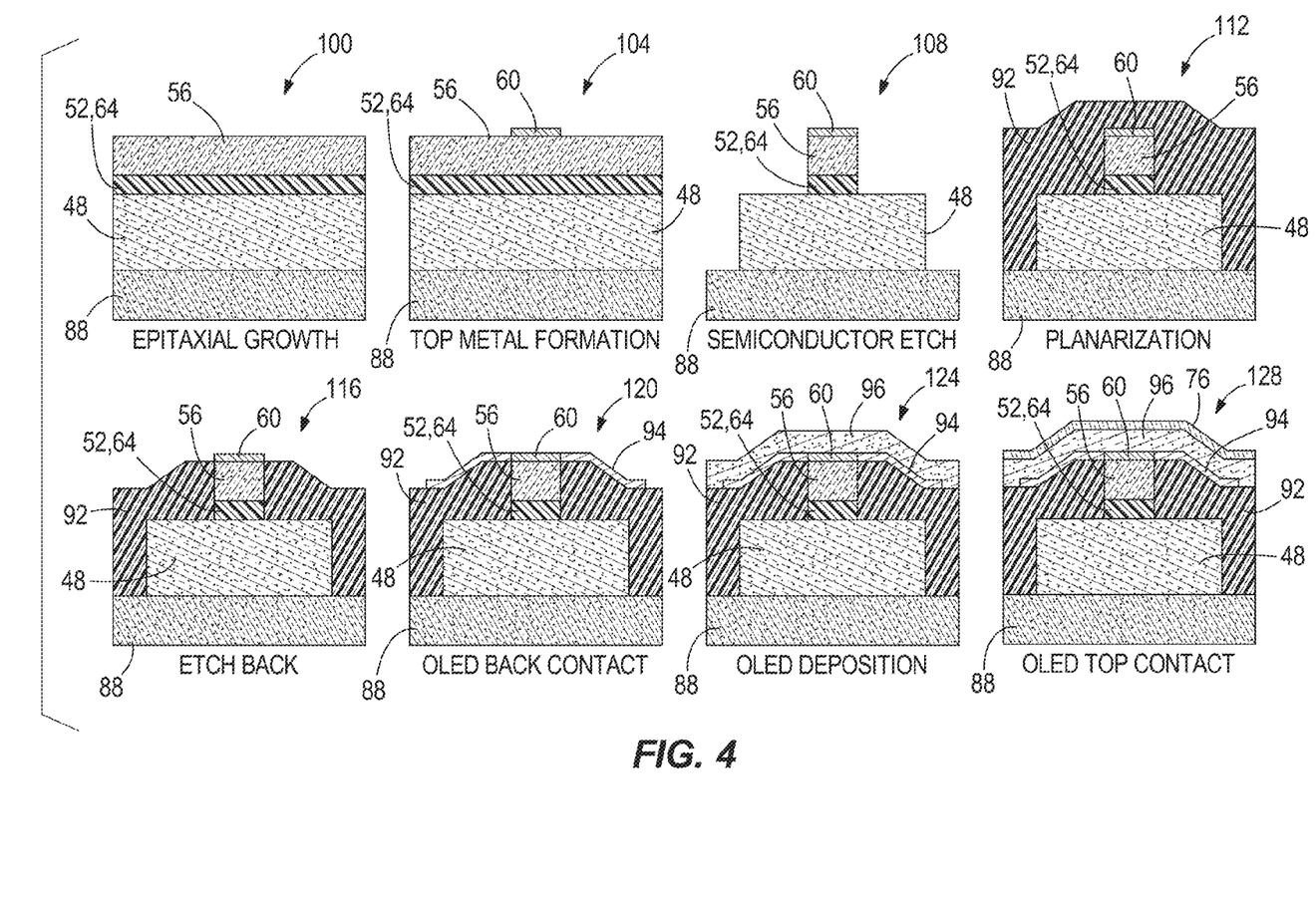
FIG. 4 illustrates one example of a process for manufacturing an example of the apparatus shown in FIG. 2, the process includes a plurality of schematic illustrations associated with exemplary steps of the process, the apparatus associated with this exemplary process includes an organic light emitting diode (OLED) and this exemplary apparatus may be one of a plurality of similar apparatuses used in the system shown in FIG. 1 to form a two-dimensional array for producing a light array, according to one aspect of the present disclosure.

In one example, the light emitting device 32 may be an organic light emitting diode (OLED). An example of an OLED is illustrated in FIG. 4 where various exemplary manufacturing steps are shown (described in more detail below). Examples of the apparatus 24 that use a metallic contact 60 and electron hole pair supply layer 64 allow utilization of a wide variety of OLED structures. The OLED may include a top contact 76 that is transparent and metal and such metal may be selected based on the OLED design.

Figure 5:
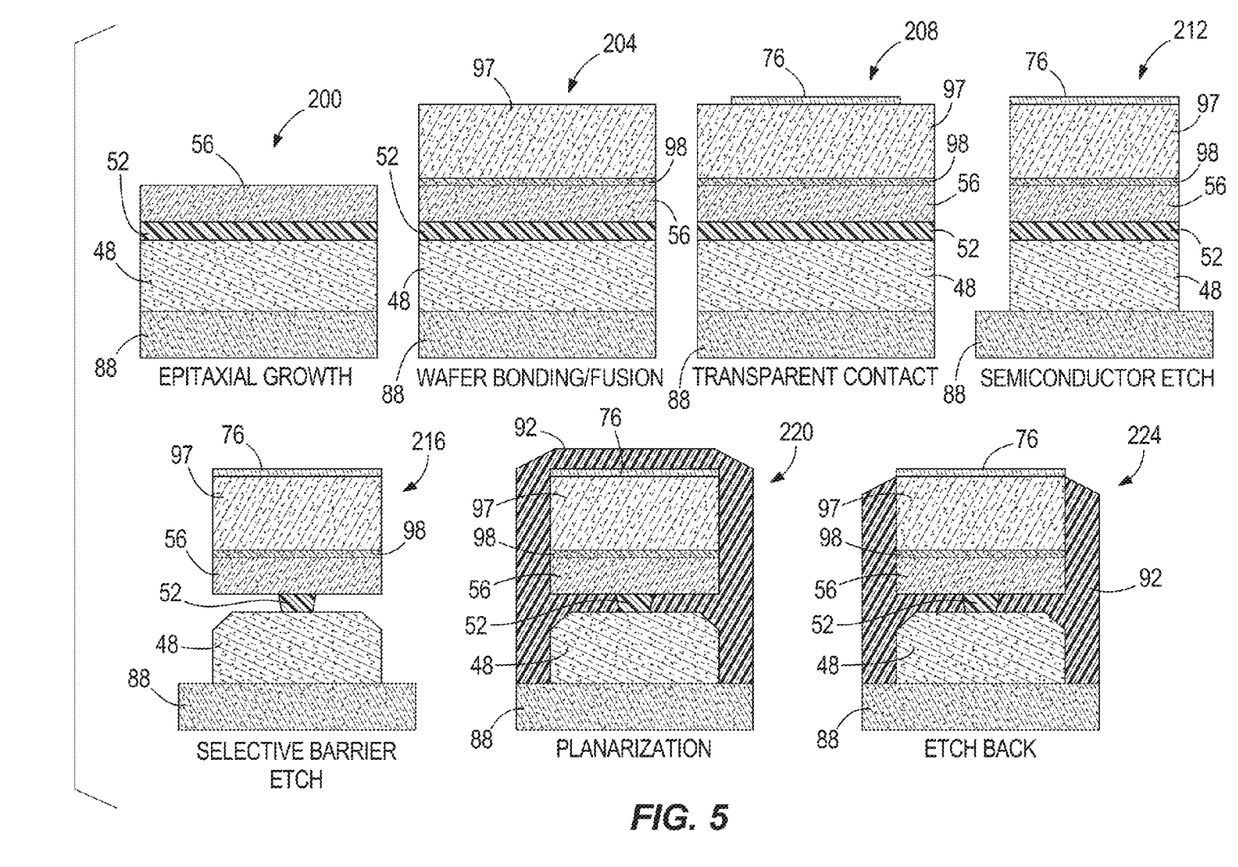
FIG. 5 illustrates another example of a process for manufacturing another example of the apparatus shown in FIG. 2, the process includes a plurality of schematic illustrations associated with exemplary steps of the process, the apparatus associated with this exemplary process includes an LED or VCSEL and this exemplary apparatus may be one of a plurality of similar apparatuses used in the system shown in FIG. 1 to form a two-dimensional array for producing a light array, according to one aspect of the present disclosure.

As indicated above, the disclosure is capable of using a wide variety of light emitting devices. To this point, processing or manufacturing steps required to create the detector 28 and light emitting devices 32 may vary. With reference to FIGS. 4 and 5, two examples of processes are shown for manufacturing apparatuses 24 including two different light emitting devices 32. FIG. 4 illustrates an example of a process including exemplary processing steps associated with the light emitting device 32 being an OLED and FIG. 5 illustrates another example of a process including exemplary processing steps associated with the light emitting device 32 being a VCSEL. It should be understood that the exemplary processes and associated exemplary steps may vary and all of such variations are intended to be within the spirit and scope of the present disclosure. For example, the processes may include fewer or more steps than the exemplary illustrated steps. Also, for example, the processes may include different steps than those illustrated. Further, for example, the exemplary steps of the processes may be performed in various orders than those illustrated.

With particular reference to FIG. 4, exemplary steps are illustrated that show an exemplary process for generating or manufacturing an apparatus 24 including an OLED as the light emitting device 32. Each OLED included in the system 20 is capable of direct up-conversion of infrared light to short wavelength light visible by the naked eye, silicon imagers or detectors, etc. In this illustrated example of the apparatus 24, the various components of the apparatus 24 are illustrated and referred to as layers. The use of the words layer and layers when referring to the various components of the apparatus 24 is not intended to be limiting upon the configuration or structure of the various components of the apparatus 24. Rather, the words layer and layers are used to describe the illustrated exemplary manufacturing process for manufacturing one example of an apparatus 24. Other words may be more appropriate for other processes.

With respect to step 100 of FIG. 4, a substrate 88 is provided, the absorber layer 48 is on top of the substrate 88, the barrier and trap layer 52 is on top of the absorber layer 48 and the injector layer 56 is on top of the barrier and trap layer 52. In this illustrated example, all layers begin with a similar width. In other examples, widths of the layers may vary. In one example, the substrate 88 may be opaque to visible light and transparent to IR light. That is, light having wavelengths in the visible range may not pass through the substrate 88 whereas light having wavelengths in the infrared range may pass through the substrate 88. In one example, the substrate 88 may be opaque to light having a wavelength less than 1000 nm and transparent to light having a wavelength greater than 1000 nm. In one example, the absorber layer 48 may be made of InGaAs. Alternatively, the absorber layer 48 may be made of other semiconductors or semiconductor materials. In one example, the injector layer 56 may be made of InP. Alternatively, the injector layer 56 may be made of other materials. The various layers in step 100 may be grown or formed on the substrate 88 and may be fused or bonded in a variety of manners. In one example, the layers may be fused using wafer fusion or bonding methods, or bonded via a conductive bonding agent. For example, AuSn eutectics could be used for bonding. Wafer bonding may be facilitated in a variety of manners such as, for example, by a conductive bonding agent (e.g., AuSn or gold eutectics), or without such conductive bonding agents.

Referring to step 104 of FIG. 4, the contact layer 60 is formed on top of the injector layer 56. In the illustrated example, the contact layer 60 is smaller in area or narrower than the injector layer 56. In one example, the contact layer 60 may be metallic. Alternatively, the contact layer 60 may be semi-metallic or non-metallic. In step 108, the barrier and trap layer 52, the injector layer 56, and the absorber layer 48 are reduced in area or width. In the illustrated example, the barrier and trap layer 52 and the injector layer 56 are reduced in width to be the same width as the contact layer 60 and the absorber layer 48 is reduced in width but is still wider than the contact layer 60, the injector layer 56, and the barrier and trap layer 52. Alternatively, the barrier and trap layer 52 and the injector layer 56 may have different widths than each other and different widths than the contact layer 60. The area or width of the layer(s) may be reduced in a variety of manners. In one example, selective wet etching may be used to achieve the reduced areas of the layer(s).

In step 112, planarization occurs by forming an insulator 92 around the contact layer 60, the injector layer 56, the barrier and trap layer 52, and the absorber layer 48. In the illustrated example, the insulator 92 is black. In one example, the insulator 92 may be a polymer including black or other dark colored dies. Alternatively, the insulator 92 may be made of different materials and have different colors. In step 116, the insulator 92 is etched back to expose the contact layer 60. In step 120, an OLED back contact 94 is formed around the contact layer 60 and on top of the insulator 92. The OLED back contact 94 is conductively coupled to the contact layer 60. In one example, the OLED back contact 94 and the contact layer 60 together form the electron hole pair supplier 64. In one example, the electron hole pair supplier 64 may be AuSn eutectics. For descriptive purposes with respect to FIG. 4, the electron hole pair supplier 64 will be referred to as the electron hole pair supply layer 64. In step 124, an OLED deposition or layer 96 is deposited or formed on top of the OLED back contact 94 and contact layer 60. In step 128, a top contact 76 is formed on top of the OLED deposition or layer 96. In one example, the top contact 76 may be transparent.

With particular reference to FIG. 5, exemplary steps are illustrated that show an exemplary process for generating or manufacturing an apparatus 24 including an LED or VCSEL as the light emitting device 32. Each LED or VCSEL included in the system 20 is capable of direct up-conversion of infrared light to short wavelength light visible by the naked eye, silicon imagers or detectors, etc. In this illustrated example of the apparatus 24, the various components of the apparatus 24 are illustrated and referred to as layers. The use of the words layer or layers when referring to the various components of the apparatus 24 is not intended to be limiting upon the configuration or structure of the various components of the apparatus 24. Rather, the words layer and layers are used to describe the illustrated exemplary manufacturing process for manufacturing one example of an apparatus 24. Other words may be more appropriate for other processes.

With respect to step 200 of FIG. 5, a substrate 88 is provided, the absorber layer 48 is on top of the substrate 88, the barrier and trap layer 52 is on top of the absorber layer 48 and the injector layer 56 is on top of the barrier and trap layer 52. In this illustrated example, all layers begin with a similar width. In other examples, widths of the layers may vary. In one example, the substrate 88 may be opaque to visible light and transparent to IR light. That is, light having wavelengths in the visible range may not pass through the substrate 88 whereas light having wavelengths in the infrared range may pass through the substrate 88. In one example, the substrate 88 may be opaque to light having a wavelength less than 1000 nm and transparent to light having a wavelength greater than 1000 nm. In one example, the absorber layer 48 may be made of InGaAs. Alternatively, the absorber layer 48 may be made of other semiconductors or semiconductor materials. In one example, the injector layer 56 may be made of InP. Alternatively, the injector layer 56 may be made of other materials. The various layers in step 200 may be grown or formed on the substrate 88 and may be fused or bonded in a variety of manners.

Referring to step 204 of FIG. 5, a LED or VCSEL layer 97 is formed on the injector layer 56. The LED or VCSEL layer 97 may be formed on the injector layer 56 in a variety of manners. In one example, the LED or VCSEL layer 97 may be formed on the injector layer 56 using wafer fusion or bonding methods. For example, the LED or VCSEL layer 97 may be bonded to the injector layer 56 using a conductive bonding agent or layer 98 (as illustrated in FIG. 5). In one example, the bonding agent 98 may be AuSn eutectics. In other examples, wafer bonding or fusing methods may be performed without such conductive bonding agents.

With reference to step 208 in FIG. 5, a top contact layer 76 is formed on top of the LED or VCSEL layer 97. In one example, the top contact 76 may be transparent. In the illustrated example, the top contact layer 76 is smaller in area or narrower than the LED or VCSEL layer 97. In step 212, the LED or VCSEL layer 97, the bonding agent layer 98, the injector layer 56, the barrier and trap layer 52, and the absorber layer 48 are all reduced in area or width. In the illustrated example, these layers are reduced in width to be the same width as the top contact layer 76. Alternatively, these layers may have different widths than each other and different widths than the top contact layer 76. The area or width of the layer(s) may be reduced in a variety of manners. In one example, selective wet etching may be used to achieve the reduced areas of the layer(s).

With continued reference to FIG. 5 and particular reference to step 216, the barrier and trap layer 52 is etched to further reduce its area or width. In this example, the barrier and trap layer 52 has an area or width that is less than or narrower than the absorber layer 48, the injector layer 56, the bonding agent layer 98, the LED or VCSEL layer 97 and the top contact layer 76. In step 220, planarization occurs by forming an insulator 92 around the top contact layer 76, the LED or VCSEL layer 97, the bonding agent layer 98, the injector layer 56, the barrier and trap layer 52, and the absorber layer 48. In the illustrated example, the insulator 92 is black. In one example, the insulator 92 may be a polymer including black or other dark colored dies. Alternatively, the insulator 92 may be made of different materials and have different colors. In step 224, the insulator 92 is etched back to expose the top contact layer 76. In one example, the bonding agent 98 is the electron hole pair supplier 64. In other examples, the bonding agent 98 in combination with other components of the apparatus 200 make up the electron hole pair supplier 64. In still other examples, another individual component or combination of components of the apparatus 200 make up the electron hole pair supplier 64.

Figure 6:
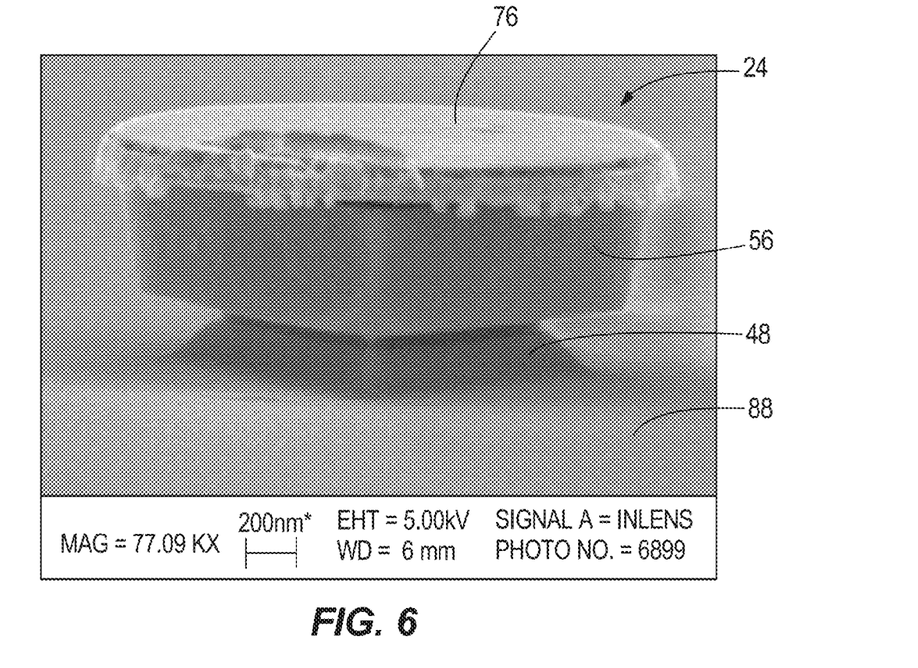
FIG. 6 is an isometric view of one example of an apparatus similar to that formed by the process shown in FIG. 5, this example of the apparatus includes an undercut achieved by using selective barrier wet etching with the undercut appropriately etched, according to one aspect of the present disclosure.
Figure 7:
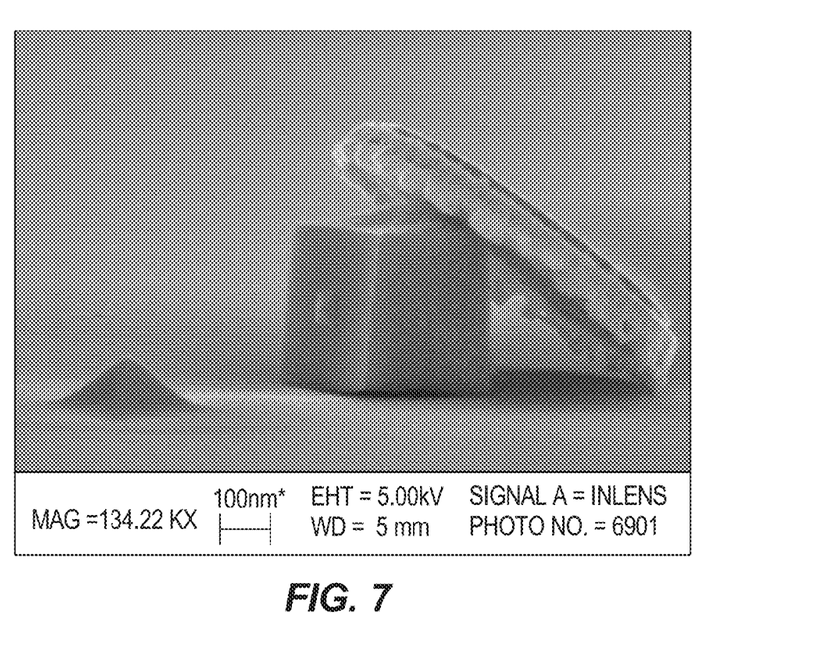
FIG. 7 is an isometric view of another example of an apparatus similar to that formed by the process shown in FIG. 5, this example of the apparatus includes an undercut achieved by using selective barrier wet etching with the undercut excessively and improperly etched.

Referring now to FIG. 6, one example of a properly manufactured apparatus 24 is illustrated. This exemplary apparatus 24 corresponds to an apparatus 24 manufactured by the exemplary process associated with FIG. 5. This apparatus 24 includes an adequate and properly formed undercut or etch of the barrier and trap layer 52. This undercut may be achieved by using selective wet etching made of, for example, H2SO4:H2O2:H2O 10:1:1 at 5° C. This exemplary undercut is a precise or appropriate undercut to form a properly etched apparatus 24. For purposes of comparison, reference is made to FIG. 7 where an excessive undercut or etch is made in the barrier and trap layer, thereby resulting in an improperly formed apparatus.

The system 20 may include other beneficial properties in addition to the integration of the detector 28 and the light emitting device 32, and the conversion of light having a first wavelength to a light having a second wavelength. For example, the apparatus 24 may provide optical isolation of the light emitting device 32 and the detector 28 in order to avoid a positive feedback between the detector 28 and the light emitting device 32. Also, for example, the apparatus 24 may provide a barrier and trap 52 that has an area smaller or narrower than an area of the absorber 48 and such a barrier and trap 52 may generate as many electron hole pairs as desired in order to provide a large gain or up-conversion. Furthermore, for example, the apparatuses 24 and system 20 provide a device that is capable of converting light wavelengths that is reduced in weight, volume and cost compared to other detectors.

The Abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While various embodiments of the disclosure have been described, it will be apparent to those of ordinary skill in the art that other embodiments and implementations are possible within the scope of the disclosure. Accordingly, the disclosure is not to be restricted except in light of the attached claims and their equivalents.

The invention claimed is:

1. An apparatus for converting light having a first wavelength to a light having a second wavelength, the apparatus comprising:
   an interband light detector comprising
      an interband absorber layer configured to absorb light having the first wavelength to generate electron-hole pairs;
      a barrier and trap layer over the absorber layer, wherein the barrier and trap layer is configured to trap one of a hole and an electron of the electron-hole pairs and configured to form a barrier to the other one of the hole and the electron of the electron-hole pairs to result in light amplification; and an injector layer over the barrier and trap layer, the injector layer configured to inject either electrons or holes into the interband absorber layer via the barrier;

a light emitting device configured to emit light having the second wavelength; and a connector layer between the injector layer and the light emitting device, the connector layer configured to supply other electron-hole pairs and to supply either electrons or holes of the other electron-hole pairs to the injector layer and to supply the other of electrons or holes of the electron-hole pairs to the light emitting device.

2. The apparatus of claim 1, wherein the barrier and trap layer is narrower in width than the interband absorber layer.

3. The apparatus of claim 1, wherein the barrier and trap layer and the injector layer are both narrower in width than the interband absorber layer.

4. The apparatus of claim 1, wherein the interband absorber layer is formed on a substrate, and wherein the substrate is transparent with respect to light having the first wavelength to enable light having the first wavelength to pass through the substrate.

5. The apparatus of claim 1, wherein the interband absorber layer is formed on a substrate, the barrier and trap layer is formed on the absorber layer, and the injector layer is formed on the barrier and trap layer.

6. The apparatus of claim 1, wherein the light emitting device is at least partially comprised of at least one of an organic light emitting diode layer, a light emitting diode layer, and a vertical cavity surface emitting laser layer.

7. The apparatus of claim 1, wherein the first wavelength is greater than the second wavelength.

8. The apparatus of claim 1, wherein the barrier and trap layer is narrower in width than both the interband absorber layer and the injector layer.

9. The apparatus of claim 1, wherein the interband absorber layer, the barrier and trap layer and the injector layer have a band structure with a type II band alignment.

10. The apparatus of claim 1, wherein the light emitting device is a light emitting diode or a vertical cavity surface emitting laser and is formed directly on the connector layer, wherein the connector layer is formed directly on the injector layer, wherein the injector layer is formed directly on the barrier and trap layer, and wherein the barrier and trap layer is formed directly on the interband absorber layer.

11. The apparatus of claim 10, wherein the barrier and trap layer is narrower in width than both the interband absorber layer and the injector layer.

12. The apparatus of claim 1, wherein the light emitting device is an organic light emitting diode and is formed directly on the connector layer, wherein the connector layer is formed directly on the injector layer, wherein the injector layer is formed directly on the barrier and trap layer, and wherein the barrier and trap layer is formed directly on the interband absorber layer.

13. The apparatus of claim 12, wherein both the barrier and trap layer and the injector layer are narrower in width than the interband absorber layer.

14. The apparatus of claim 1, wherein the light having the first wavelength is infrared light and the light having the second wavelength is visible light.

15. The apparatus of claim 1, wherein the connector layer comprises a metal layer or a tunnel junction layer.

16. A method of converting an-input light having a first wavelength to an-output light having a second wavelength, the method comprising:

illuminating an apparatus with input light having a first wavelength, the apparatus comprising:

an interband light detector comprising an interband absorber layer configured to absorb the input light having the first wavelength to generate electron-hole pairs;

a barrier and trap layer over the absorber layer, wherein the barrier and trap layer is configured to trap one of a hole and an electron of the electron-hole pairs and to form a barrier to the other one of the hole and the electron of the electron-hole pairs; and an injector layer over the barrier and trap layer, the injector layer configured to inject either electrons or holes into the interband absorber layer;

a light emitting device configured to emit output light having the second wavelength; and a connector layer between the injector layer and the light emitting device, the connector layer configured to supply other electron-hole pairs and to supply either electrons or holes of the other electron-hole pairs to the injector layer and to supply the other of electrons or holes of the other electron-hole pairs to the light emitting device; and emitting the output light having the second wavelength.

17. The method of claim 16, wherein the first wavelength is greater than 1000 nanometers and the second wavelength is less than 1000 nanometers.

18. The method of claim 16, wherein the input light having the first wavelength is infrared light and the output light having the second wavelength is visible light.

19. The apparatus of claim 16, wherein the connector layer comprises a metal layer or a tunnel junction layer.

* * * * *